United States Patent
Kikuchi et al.

(10) Patent No.: US 10,018,753 B2
(45) Date of Patent: Jul. 10, 2018

(54) LIGHT DIFFUSION SHEET FOR ORGANIC ELECTROLUMINESCENT ELEMENT AND ORGANIC ELECTROLUMINESCENT PANEL

(71) Applicants: Konica Minolta, Inc., Chiyoda-ku, Tokyo (JP); UNITIKA LTD., Amagasaki-shi, Hyogo (JP); UNITIKA GLASS FIBER CO., LTD., Uji-shi, Kyoto (JP)

(72) Inventors: Koutarou Kikuchi, Hachioji (JP); Masato Kimura, Tokyo (JP); Taishi Torikai, Gifu (JP)

(73) Assignees: KONICA MINOLTA, INC., Tokyo (JP); UNITIKA LTD., Tokyo (JP); UNITIKA GLASS FIBER CO., LTD., Gifu (JP)

(*) Notice: Subject to any disclaimer, the term of this patent is extended or adjusted under 35 U.S.C. 154(b) by 0 days.

(21) Appl. No.: 14/631,096

(22) Filed: Feb. 25, 2015

(65) Prior Publication Data

US 2016/0054484 A1 Feb. 25, 2016

(30) Foreign Application Priority Data

Feb. 25, 2014 (JP) .................................. 2014-033876

(51) Int. Cl.
*G02B 5/00* (2006.01)
*G02B 5/02* (2006.01)
*F21V 5/00* (2018.01)
*H01L 51/52* (2006.01)

(52) U.S. Cl.
CPC ............ *G02B 5/0236* (2013.01); *F21V 5/002* (2013.01); *G02B 5/0278* (2013.01); *H01L 51/5268* (2013.01); *H01L 51/5246* (2013.01)

(58) Field of Classification Search
CPC ...... G02B 5/0242; G02B 5/0236; H01L 51/52; F21V 5/002
USPC .............................................. 257/40; 359/599
See application file for complete search history.

(56) References Cited

U.S. PATENT DOCUMENTS

| | | | |
|---|---|---|---|
| 2005/0285521 A1* | 12/2005 | Menda | H01L 51/5253 313/512 |
| 2006/0257678 A1* | 11/2006 | Benson, Jr. | C08K 7/04 428/542.8 |
| 2007/0053080 A1* | 3/2007 | Harada | G02B 6/0051 359/809 |

(Continued)

FOREIGN PATENT DOCUMENTS

| JP | 08195114 A | 7/1996 |
|---|---|---|
| JP | 08259637 A | 10/1996 |

(Continued)

OTHER PUBLICATIONS

Notification of Reasons for Refusal corresponding to JP Patent Application No. 2014-033876; dated Jan. 9, 2018.

*Primary Examiner* — Sean Gramling
*Assistant Examiner* — Gerald J Sufleta, II
(74) *Attorney, Agent, or Firm* — Cantor Colburn LLP

(57) ABSTRACT

A light diffusion sheet for an organic electroluminescent element to be used in an organic electroluminescent panel. The light diffusion sheet includes: a glass fiber cloth composed of at least one glass fiber; silica on a surface of the glass fiber or between the glass fibers; and at least one selected from a group consisting of metal alkoxides and reaction products of metal alkoxides.

6 Claims, 1 Drawing Sheet

(56) References Cited

U.S. PATENT DOCUMENTS

| | | | |
|---|---|---|---|
| 2007/0236938 A1* | 10/2007 | Ouderkirk | G02B 5/0236 362/339 |
| 2011/0298361 A1* | 12/2011 | Matsunaga | G02B 5/0242 313/504 |
| 2013/0141907 A1* | 6/2013 | Doi | C08J 5/043 362/235 |
| 2015/0162566 A1 | 6/2015 | Kikuchi | |
| 2015/0349296 A1* | 12/2015 | Mashima | C09J 9/00 257/40 |
| 2016/0070036 A1* | 3/2016 | Nakamura | G02B 5/0242 359/599 |

FOREIGN PATENT DOCUMENTS

| | | |
|---|---|---|
| JP | 08290528 A | 11/1996 |
| JP | 08306215 A | 11/1996 |
| JP | 2001055646 A | 2/2001 |
| JP | 2006026973 A | 2/2006 |
| JP | 2007203724 A | 8/2007 |
| JP | 2011040265 A | 2/2011 |
| JP | 2013035939 A1 | 2/2013 |
| WO | 2014017242 A1 | 1/2014 |

\* cited by examiner

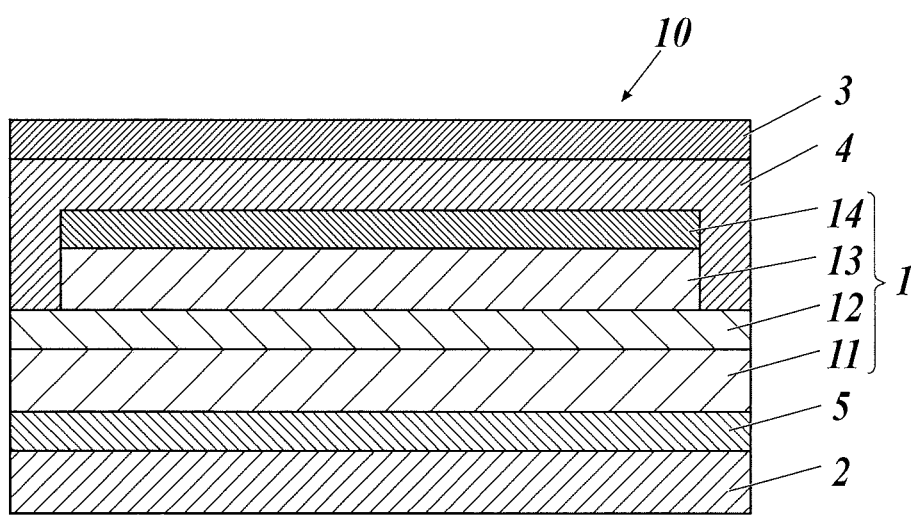

LIGHT DIFFUSION SHEET FOR ORGANIC ELECTROLUMINESCENT ELEMENT AND ORGANIC ELECTROLUMINESCENT PANEL

FIELD OF THE INVENTION

The present invention relates to a light diffusion sheet for an organic electroluminescent element, and an organic electroluminescent panel containing this light diffusion sheet. More concretely, the present invention relates to a light diffusion sheet for an organic electroluminescent element, the sheet exhibiting enhanced incombustibility and light diffusion property.

DESCRIPTION OF RELATED ART

Illumination devices such as surface illumination devices and internally illuminated signboards are generally required to emit light of sufficient luminance from their light-emitting surfaces. Such surfaces are provided with light diffusion sheets for diffusing light emitted from light sources.

Examples of light diffusion sheets include resin sheets, such as acrylic resin sheets, frosted glass plates, and glass fiber sheets using glass fiber fabrics as ground fabrics (see, e.g., Japanese Patent Application Laid-Open Nos. H08-195114, H08-259637, H08-290528, and H08-306215).

Further disclosed are a glass fiber light diffusion sheet having more improved light diffusion property than those of the above light diffusion sheets (see, e.g., Japanese Patent Application Laid-Open No. 2001-055646) and a light diffusing incombustible composite member having improved incombustibility in addition to improved light diffusion property (see, e.g., Japanese Patent Application Laid-Open No. 2013-35939).

However, current advanced illumination devices require glass fiber light diffusion sheets having further enhanced light diffusion properties than the conventional ones.

For example, the glass fiber light diffusion sheet described in Japanese Patent Application Laid-Open No. 2001-055646, which has a resin coating layer composed of a fluorinated or silicone resin on at least one surface of a glass fiber fabric in order to enhance light diffusion property and thus has light diffusion property to some extent, cannot satisfy current severe requirement on light diffusion property.

The light diffusing incombustible composite member described in Japanese Patent Application Laid-Open No. 2013-35939, which is coated or impregnated with a condensation-reactive silicone resin to enhance incombustibility while maintaining light diffusion property to some extent, also cannot satisfy current severe requirement on light diffusion property though it enhances the incombustibility.

That is, conventional glass fiber light diffusion sheets have structural and mechanical characteristics, incombustibility, antifouling properties, and light diffusion properties which are improved to certain extents; however the level of the light diffusion properties is still insufficient for current advanced illumination apparatuses having organic electroluminescent elements.

SUMMARY OF THE INVENTION

An object of the present invention, which has been accomplished in view of the above problems, is to provide a light diffusion sheet for an organic electroluminescent element having high levels of incombustibility and light diffusion property.

The present inventors, who have diligently studied to accomplish the above object, have found that a light diffusion sheet for an organic electroluminescent (hereinafter, also referred to as "organic EL") element can exhibit significantly enhanced incombustibility and light diffusion property when the light diffusion sheet is formed of a glass fiber cloth coated with silica or metal alkoxide, and thereby accomplished the present invention.

That is, the object of the invention can be accomplished by the following means.

1. Light diffusion sheet for an organic electroluminescent element to be used in an organic electroluminescent panel includes: a glass fiber cloth composed of at least one glass fiber; silica on a surface of the glass fiber or between the glass fibers; and at least one selected from a group consisting of metal alkoxides and reaction products of metal alkoxides.

2. The light diffusion sheet for the organic electroluminescent element of item 1, wherein the light diffusion sheet has a total light transmittance ranging from 45 to 60%.

3. The light diffusion sheet for the organic electroluminescent element of item 1 or item 2, wherein the light diffusion sheet has a haze value of 90% or more.

4. The light diffusion sheet for the organic electroluminescent element of any one of items 1-3, wherein the glass fiber cloth has a mass per unit area ranging from 80 to 120 g/m$^2$, and the glass fiber cloth has a thickness ranging from 80 to 120 µm.

5. An organic electroluminescent panel comprising the light diffusion sheet for the organic electroluminescent element of any one of items 1-4.

Effects of the Invention

It becomes possible to improve the incombustibility and light diffusion property as a light diffusion sheet for the organic electroluminescent element by having silica on a surface of the glass fiber or between the glass fibers and at least one selected from a group consisting of metal alkoxides and reaction products of metal alkoxide.

By using this technology, it becomes possible to provide a light diffusion sheet for an organic electroluminescent element having high levels of incombustibility and light diffusion property which can be used for a for the organic electroluminescent panel (illumination equipments).

The mechanism of illumination and the operation mechanisms of the effect of the invention are not clear enough. However, inventors think that following mechanism make the effects.

Inventors estimate that the haze value is improved by having silica and at least one selected from a group consisting of metal alkoxides and reaction products of metal alkoxides reaction products in the glass fiver cloth to fix the silica on the glass fiber cloth. Further, inventors estimate that the level of incombustibility of the glass fiber cloth has been further improved by that the metal alkoxides which have been fixed on the glass fiber cloth changes into reaction products having high level of incombustibility of metal oxide. Further the inventors estimates that the light emission of an organic electroluminescent element passing through the glass fiber cloth is irradiated to particles of silica, refracted and diffused which makes the light emission being uniformly dispersed. Inventors estimate that this improves light diffusion property and angular dependence.

BRIEF DESCRIPTION OF THE DRAWINGS

The present invention will become more fully understood from the detailed description given hereinbelow and the appended drawings, and thus are not intended as a definition of the limits of the present invention, and wherein:

FIG. 1 is a schematic cross-sectional view of a light diffusion sheet for an organic electroluminescent element.

PREFERRED EMBODIMENT OF THE PRESENT INVENTION

The light diffusion sheet for an organic electroluminescent (EL) element of the present invention has the feature that a glass fiber cloth used in the light diffusion sheet for the organic EL element includes silica and at least one selected from the group consisting of metal alkoxides and reaction products of metal alkoxides.

This configuration is common or corresponds to the present invention which is related to claims 1-5.

In an embodiment of the present invention, the total light transmittance ranges preferably from 45 to 60% from the perspective of the advantageous effects of the present invention. Such a range can be effective to enhance the light extraction efficiency.

In an embodiment of the present invention, the haze value is preferably 90% or more from the perspective of the advantageous effects of the present invention. Such a haze value can be effective to enhance the angular dependence of chromaticity.

In an embodiment of the present invention, the glass fiber cloth preferably has a mass per unit area ranging from 80 to 120 g/m2 and a thickness ranging from 80 to 120 μm from the perspective of the advantageous effects of the present invention. Such a glass fiber cloth can be effective to enhance the total light transmittance.

The light diffusion sheet for the organic EL element of the present invention can be suitably applied to an organic electroluminescent panel. Such an organic electroluminescent panel can be effective to achieve excellent light extraction efficiency and high incombustibility.

The present invention, the constituents of the present invention, and the embodiments for carrying out the present invention will now be described in detail. As used herein, a numerical range indicated with the term "to" is meant to be inclusive of the lower and upper boundary values.

[Overview of Light Diffusion Sheet for Organic EL Element]

The light diffusion sheet for the organic electroluminescent element of the present invention (hereinafter, also referred to as "light diffusion sheet for the organic EL element"), which is used in an organic EL panel, has a glass fiber cloth formed of glass fibers. The glass fiber cloth always have silica on the surfaces of the glass fibers or between the glass fibers, and has at least one selected from the group consisting of metal alkoxides and reaction products of metal alkoxides.

The constituents of the light diffusion sheet for the organic EL element will now be described in detail.
<Glass Fiber Cloth>

The glass fiber cloth of the present invention is glass fiber fabrics, which are composed of bundles (strands) of glass fibers, and may be made of any known glass fiber fabrics. The glass fibers may be of any type, for example, may be general-purpose alkali-free glass fibers, alkali-containing glass fibers having acid resistance, glass fibers having high strength and high modulus, and alkali-resistant glass fibers. The glass fiber cloth may be woven in any weave, such as plain, twill, satin, basket, or ribbed weave.

The glass fibers of the glass fiber cloth preferably each has a diameter ranging from 3 to 10 μm from the perspective of, for example, the light diffusion property of the light diffusion sheet. A glass fiber of 3 to 10 μm in diameter can allow the glass fiber cloth to have a desirable total light transmittance and a desirable haze value, which will be described later.

The glass fiber cloth preferably has a mass per unit area (hereinafter, also referred to as "basis weight") ranging from 80 to 120 g/m2 from the perspective of, for example, the light diffusion property of the light diffusion sheet. A mass per unit area of 80 to 120 g/m2 can allow the resulting light diffusion sheet to exhibit desirable light diffusion property, high light transmittance, and high durability to ensure that the glass fiber cloth has less damaged during the manufacturing process.

The glass fiber cloth preferably has a thickness ranging from 80 to 120 μm from the perspective of light diffusion and transmission properties. A thickness of 80 to 120 μm can be effective to enhance the total light transmittance, so that the light diffusion and transmission properties are further well balanced.

The glass fiber cloth is preferably subjected to a spread-out process to open (loosen) multiple fibers.

For example, a glass fiber cloth, which is formed of multiple glass fibers that are spread-out and loosened from each other so as to increase the total exposed surface area of the glass fibers in a sheet, can have a thin thickness, resulting in higher total light transmittance and a higher haze value.

The spread-out process may be any known process using, for example, high pressure water jetting, Vibro washer, ultrasonic vibration, and press rolling. The spread-out process may simultaneously be carried out during or after a weaving process of glass fibers. Alternatively, the spread-out process may be carried out before, during, or after a heat cleaning process, which will be described below, or may be carried out during or after the above-mentioned surface processing, more preferably before the heat cleaning process.

The glass fiber cloth preferably used is a woven glass filament fabric, usually referred to as greige, which is subjected to desizing by heat, i.e., a heat cleaning to remove organic substances on the surface of glass fibers and then subjected to a surface treatment that is carried out with mainly a silane coupling agent.

Such a heat cleaning can remove a sizing agent adhering to the greige of the glass fiber cloth.

The heat cleaning process is generally carried out by placing a glass fiber cloth in a heating furnace at a temperature ranging from about 300 to 400° C. for about 24 to 120 hours, preferably about 48 to 96 hours.
<Colloidal Silica>

The glass fiber cloth of the present invention has the feature of always including silica (silicon dioxide) on the surfaces of the glass fibers or between the glass fibers, which fibers form the glass fiber cloth. In this state, the silica is chemically or physically adherent to the surface of the glass fibers, or disposed between the glass fibers. The silica may be present in any form as long as it exists on the surface of, or between the glass fibers.

The glass fiber cloth is, for example, immersed, coated, or sprayed with a solution containing silica so that the glass fiber cloth is impregnated with silica. The impregnation herein is to soak the glass fiber cloth in the solution so as to fill the inside of the glass fiber cloth with the solution. The solution to impregnate silica in the present invention refers to liquid in the state of solution, suspension, or dispersion.

The silica may have any shape and size that are suitable for the use, for example, preferably have a spherical shape and an average particle diameter ranging from 5 to 300 nm, more preferably from 10 to 100 nm, furthermore preferably from 15 to 30 nm. The silica contained in the solution is preferably colloidal silica.

Any commercially-available colloidal silica can be used for the glass fiber cloth of the present invention.

Specific examples thereof include products named "SNOWTEX-XL", "SNOWTEX-YL", "SNOWTEX-ZL", "PST-2", "SNOWTEX-20", "SNOWTEX-30", "SNOWTEX-C", "SNOWTEX-O", "SNOWTEX-OS", "SNOWTEX-OL", and "SNOWTEX-50" (available from Nissan Chemical Industries, Ltd.); "ADELITE AT-30", "ADELITE AT-40", and "ADELITE AT-50" (available from Nippon Aerosil Co., Ltd.); and "Silicadol 40" (available from NIPPON CHEMICAL INDUSTRIAL CO., LTD.). Among them, particularly preferred are aqueous dispersions, such as products named "SNOWTEX-O", "SNOWTEX-OS", "SNOWTEX-OL" and "Silicadol 40".

<Saccharides (Enzyme-Treated)>

The solution containing silica with which the glass fiber cloth is impregnated may further contain enzyme-treated saccharides in addition to the colloidal silica. It is believed that enzyme-treated saccharides added to the solution enhance the stability of the solution and the adhesion of the silica to the glass fiber cloth.

In place of the enzyme-treated substance, enzymes and saccharides may be added to a system containing colloidal silica such that an enzyme-catalyzed reaction is carried out in the system.

The solution may also contain, for example, colloidal silica, metal alkoxides, isopropyl alcohol, and saccharide degrading enzymes, such as, cyclodextrin glucosyltransferase and alginate lyases.

Examples of the saccharides include monosaccharides and polysaccharides and derivatives thereof. Preferred examples include cyclodextrin, chitosan, guar gum, xanthan gum, locust bean gum, tragacanth gum, alginate, pectin, carrageenan, chitosan, xylan, pullulan, methyl cellulose and carboxymethyl cellulose (CMC).

They may be used alone or in combination. At least cyclodextrin and/or chitosan is preferably contained. Preferred are cyclodextrin and chitosan, more preferred are cyclodextrin, chitosan and pullulan.

<Enzymes>

Examples of the enzymes treating saccharides include hydrolases, glycosyltransferases and isomerases, which may be used alone or in combination. Among them, preferred are hydrolases and glycosyltransferases, most preferred are hydrolases. These enzymes may be known ones.

Examples of the hydrolases include dextranases, hemicellulases, β-galactomannanases (β-galactosidases), pectinesterases, pullulanases, alginate lyases, xylanases, pectinases, cellulases and amylases.

Examples of transferases include cyclomaltodextrin glucanotransferases, cyclodextrin glucosyltransferases, dextrin dextranases, β-fructofuranosidases and β-galactosidases.

Examples of isomerases include racemases and glucose isomelases.

Appropriate enzymes are selected depending on the used saccharides such as polysaccharides.

For example, hemicellulases and/or β-galactomannanases are used in combination with polysaccharides including locust bean gum, xanthan gum, and guar gum; alginate lyases are used in combination with alginate; chitosanases and/or pectinases are used in combination with chitosan; pectinases are used in combination with pectin; xylanases are used in combination with xylan; cellulases are used in combination with carboxymethyl cellulose; and cyclomaltodextrin glucanotransferases, cyclodextrin glucosyltransferases, and/or dextranases are used in combination with cyclodextrin.

These enzymes may be purified or crude enzymes, or microorganisms producing these enzymes may also be used as enzyme sources.

<Colloidal Silica Solution>

In the present invention, each component in the colloidal silica solution may be used in any content that fits the object of the present invention. The contents, respectively, of the colloidal silica and the enzyme-treated saccharides are generally 10 to 60 mass % and 0 to 5 mass %, preferably 20 to 50 mass % and 0.05 to 2 mass %, relative to water.

As an example of a preparing method of the colloidal silica solution, the colloidal silica solution may contain various additives that fit the object of the present invention. Examples of such additives include inorganic fillers, flame retardants, antioxidants, antistatic agents, and lubricants.

Examples of the inorganic fillers include calcium carbonate, barium sulfate, silica sand, talc, clay, mica, silica, zeolite, and graphite.

Preferred examples of the flame retardants include metal hydroxides and hydrous inorganic crystalline compounds, more specifically, aluminum hydroxide, magnesium hydroxide, calcium hydroxide, basic magnesium carbonate, hydrotalcites (e.g., hydrotalcite, stichtite, and pyroaurite), dihydrate gypsum, and calcium aluminate.

Examples of the antioxidants include phenolic and amine-based antioxidants.

Examples of the antistatic agents include anionic, cationic, and nonionic surfactants.

Examples of the lubricants include hydrocarbon, fatty acid, fatty acid amide, ester, alcohol, and metal soap-based lubricants.

The additives may be compounded in the colloidal silica solution in any content that fits the object of the present invention, generally 50 mass % or less, preferably 30 mass % or less relative to the binder solution.

The colloidal silica solution can be prepared as follows: colloidal silica, saccharide(s), enzyme(s) and optional additives each are gradually added to water and then mixed; or saccharide(s) and enzyme(s) added to water are stirred to facilitate an enzyme-catalyzed reaction, colloidal silica and optional additives are added thereto, and then these are mixed, such that the colloidal silica solution has a solid concentration of 0.1 to 50 mass % (preferably 1 to 40 mass %, more preferably 5 to 40 mass %), a viscosity of 50 to 500 mPa·s (preferably 200 to 300 mPa·s, more preferably 230 to 270 mPa·s) at 25° C.; a pH of 7 to 14 (preferably 9 to 13, more preferably 10 to 12) at 25° C., and a specific gravity of 1.1 to 1.5 (preferably 1.2 to 1.4).

<Metal Alkoxides>

Examples of the metal alkoxides (also referred to as metal alcoholates) in the present invention include titanium alkoxides, zirconium alkoxides, aluminum alkoxides, antimony alkoxides, and silica alkoxides (alkoxysilanes or alkyl silicates).

Examples of the alcohol constituting the metal alkoxides include general alcohols, such as methanol, ethanol, n-propanol, i-propanol, n-butanol, t-butanol, n-octanol, 2-ethylhexanol, stearyl alcohol, cyclohexanol, phenol, and benzyl alcohol.

Examples of the alkyl silicates that are preferably used include methyl silicates, ethyl silicates, n-propyl silicates, and n-butyl silicates having a degree of polymerization (n) of 20 or less, more preferably ethyl silicates and n-propyl silicates having a degree of polymerization (n) of 1, particularly preferably ethyl silicates having a degree of polymerization (n) of 1. These metal alcoholates may be used alone or in combination. Among them, preferred are alkyl silicates from the perspective of, for example, the refractive index difference relative to inorganic oxide particles and the adhesiveness.

Examples of such metal alkoxides include commercially-available products, in particular, products named "AR-709MD-CR.02" (available from A.R.D.); "FJ803" (available from GRANDEX Co., Ltd.); "TMOS", "Methyl Silicate 51", and "N-POS" (available from FUSO CHEMICAL CO., LTD.); "Ethyl Silicate 28", "N-Propyl Silicate", and "Ethyl Silicate 40" (available from COLCOAT CO., LTD.). Among them, particularly preferred are products named "AR-709MD-CR.02" (available from A.R.D.) and "FJ803" (available from GRANDEX Co., Ltd.) from the perspective of light diffusion property.

<Metal Alkoxide Solution>

The solution containing metal alkoxide used in the present invention preferably contains enzyme-treated saccharide or a mixture of saccharide and enzyme. The enzyme-treated saccharides and the mixtures of saccharides and enzymes that can be used are the same as those contained in the solution containing silica. It is believed that adding enzyme-treated saccharides and the like to the solution enhance the stability of the solution and the adhesion of at least one of the metal alkoxides and the reaction products of the metal alkoxides to the glass fiber cloth.

Each component in the metal alkoxide solution may be used in the present invention in any content that fits the object of the present invention. The contents, respectively, of the metal alkoxide and the enzyme-treated saccharide is in a range of generally 10 to 60 mass % and 0 to 5 mass %, preferably 20 to 50 mass % and 0.05 to 2 mass % relative to water.

The metal alkoxide solution may contain various additives that fit the object of the present invention. Examples of such additives include inorganic fillers, flame retardants, antioxidants, antistatic agents and lubricants. The additives that can be used are the same as those mentioned above.

[Production of Light Diffusion Sheet for Organic EL Element]

The light diffusion sheet for the organic EL element of the present invention is preferably prepared as follows: a glass fiber cloth is subjected to a heat cleaning, treated with a silane coupling agent, and then subjected to the impregnation. In a preferred embodiment of the present invention, the glass fiber cloth is subjected to the heat cleaning (heat cleaning process), treated with a silane coupling agent (silane coupling agent treatment process), and then subjected to an impregnation process which is followed by a drying process to be described later so as to produce a glass sheet.

Preferred embodiments and individual processes of the present invention will now be described.

(Heat Cleaning Process)

The heat cleaning process involves heat cleaning of a glass fiber cloth. Any glass fiber cloth that fits the object of the present invention may be used, generally a greige of a glass fiber cloth. The heat cleaning can remove a sizing agent from the greige of the glass fiber cloth.

In the heat cleaning, a glass fiber cloth is placed in a heating furnace at a temperature ranging from about 300 to 400° C. for about 24 to 120 hours, preferably about 48 to 96 hours.

(Silane Coupling Agent Treatment Process)

A silane coupling agent is bonded or fixed to a glass fiber cloth, generally through impregnation of the glass fiber cloth with a silane coupling agent solution prepared by dissolving the silane coupling agent in a solvent so that the concentration of the silane coupling agent becomes about 0.01 to 20 mass %, preferably about 0.1 to 5 mass %.

Examples of the silane coupling agent used in the present invention include 3-glycidoxypropylmethyldiethoxysilane, 2-(3,4-epoxycyclohexyl)ethyltrimethoxysilane, 2-glycidoxyethoxytrimethoxysilane, 2-glycidoxyethyltriethoxysilane, 3-aminopropyltrimethoxysilane, 3-aminopropyltriethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, vinyltrimethoxysilane, vinyltriethoxysilane, 3-methacryloxypropylmethyldimethoxysilane, 3-acryloxypropyl trimethoxysilane, 3-ureidopropyltriethoxysilane, 3-mercaptopropylmethyldimethoxysilane, 3-mercaptopropyltrimethoxysilane, and 3-isocyanatepropyltriethoxysilane. After a silane coupling agent is bound to a resin backbone, the unreacted silane coupling agent or the compound produced by a reaction between the silane coupling agents may adhere to a glass fiber cloth.

(Colloidal Silica Impregnation Process)

Any colloidal silica impregnation process may be employed that can impregnate a glass fiber cloth after the silane coupling treatment with a binder solution containing, for example, water and colloidal silica.

The binder solution can generally be prepared by dissolving or dispersing, for example, colloidal silica in water.

Any technique may be employed to impregnate a glass fiber cloth with a binder solution. Examples thereof include immersing, coating, and spraying. Specific examples include known techniques as follows: a traveling glass fiber cloth, which is just before wound up into a bobbin or a center roll of a winder, is immersed in a binder solution contained in a bath, an excess binder solution is squeezed off, for example, through a nip roll, and then the glass fiber cloth including an appropriate amount of the binder solution is wound up into the center roll; alternatively, a binder solution is applied with a brush or sprayed onto a glass fiber cloth wound up into a center roll of a winder.

The adhesion amount of the binder solution may be any amount that fits the object of the present invention, preferably 0.001 to 50 mass %, more preferably 0.01 to 30 mass %, most preferably 0.1 to 20 mass % in solid content relative to the glass fiber cloth, from the perspective of preparation of a glass sheet having excellent light transmitting property.

(Metal Alkoxide Impregnation Process)

The glass fiber cloth impregnated with colloidal silica is then impregnated with a solution containing the above-mentioned metal alkoxide(s) (hereinafter, also referred to as metal alkoxide solution).

The metal alkoxide solution may contain the above-mentioned commercially-available products and enzyme-treated saccharides. The glass fiber cloth impregnated with colloidal silica may be impregnated with the solution by any known technique employed in impregnation with the binder solution.

The adhesion amount of the metal alkoxide solution may be any amount that fits the object of the present invention, preferably 0.001 to 50 mass %, more preferably 0.01 to 30 mass %, most preferably 0.1 to 20 mass % in solid content relative to the glass fiber cloth from the perspective of preparation of a glass sheet having excellent light transmitting property.

(Drying Process)

In this step, the resultant in the metal alkoxide impregnation process is dried into a light diffusion sheet for an organic EL element.

The drying method may be any known technique that fits the object of the present invention, for example, natural drying or artificial drying with a dryer, at any temperature that fits the object of the present invention, generally 20 to 500° C., preferably 80 to 200° C. The drying time fitting the object of the present invention is generally 1 second to 1 week, preferably 30 seconds to 3 days, more preferably 1 minute to 20 minutes.

The resulting light diffusion sheet for the organic EL element has a sheet shape, high light transmittance, high plasticity/flexibility, and high incombustibility that precludes a lot of smoke emission in case of fire. The light diffusion sheet for the organic EL element, which is produced without use of large amounts of combustible additives as mentioned above, is generally classified into incombustible one in accordance with the combustibility standards for materials for use on railways, "Ministerial Ordinance to Provide Technical Regulatory Standards on Railways" of the Ministerial Ordinance No. 151 prescribed by the Ministry of Land, Infrastructure, Transport and Tourism in 2001, and is resistant to melting and dripping.

Moreover, the light diffusion sheet for the organic EL element has a total light transmittance of preferably 20 to 90%, more preferably 45 to 60% as measured in accordance with the method A of JIS K 7105. Such a total light transmittance can be effective to enhance the light extraction efficiency.

The glass sheet can be produced to have a total light transmittance within the preferred range described above by, for example, suitably adjusting the thickness and the basis weight of the materials of the glass fiber cloth, and the refractive index of the binder solution (e.g., type of the additives contained in the binder solution) during the usual manufacturing process of the glass sheet.

In the present invention, the light diffusion sheet for the organic EL element has a haze value of, preferably 90% or more, more preferably 95% or more, furthermore preferably 98% or more. Such a haze value can be effective to enhance the angular dependence of chromaticity.

The suitable haze value can also be achieved by adjusting the thickness and the basis weight of the glass fiber cloth as in the case of the total light transmittance.

[Organic Electroluminescent Panel]

The light diffusion sheet for the organic EL element of the present invention can preferably be used in the organic electroluminescent panel, and the panel has excellent light extraction efficiency and high incombustibility.

As used herein, the term "organic electroluminescent panel" refers to a panel-shaped device that is provided with an organic EL element. Examples thereof include illuminating and display devices that are provided with organic EL elements.

The way to apply the light diffusion sheet for the organic EL element of the present invention to the organic EL panel will now be described in detail with reference to FIG. 1.

FIG. 1 shows an example of the organic EL panel 10 of the present invention including an anode 12, an organic compound layer 13, and a cathode 14 that are deposited in this sequence on one surface of an element substrate 11 that are sealed with a sealing member 3 with an adhesive layer 4 interposed therebetween. The other surface of the element substrate 11 is overlaid by a light diffusion sheet 2 for an organic EL element with an adhesive layer 5 interposed therebetween.

[Configuration of Organic EL Element]

Typical constituents of the organic EL element used in the present invention will now be described in detail.

The organic EL element 1 used in the present invention has an organic EL structure (also referred to as light emitting part), an example of which at least includes a first electrode (anode) 12, an organic compound layer 13 including a light emitting layer, and a second electrode (cathode) 14 that are deposited on an element substrate 11. Specifically, an example organic EL structure includes a first electrode (anode) 12, an organic compound layer 13 at least composed of a hole transporting layer, a light emitting layer, and a cathode buffer layer (electron injecting layer), and a second electrode (cathode) 14 that are deposited on an element substrate 11, and sealed with a sealing member 3 through an adhesive layer 4.

Typical examples of the layer configuration of the organic EL structure used in the present invention are as follows:

(1) Substrate/first electrode (anode)/organic layer (light emitting layer)/second electrode (cathode)/adhesive/sealing member (2) Substrate/first electrode (anode)/organic layer (light emitting layer)/electron transporting layer/second electrode (cathode)/adhesive/sealing member (3) Substrate/first electrode (anode)/hole transporting layer/organic layer (light emitting layer)/hole blocking layer/electron transporting layer/second electrode (cathode)/adhesive/sealing member (4) Substrate/first electrode (anode)/hole transporting layer (hole injecting layer)/organic layer (light emitting layer)/hole blocking layer/electron transporting layer/cathode buffer layer (electron injecting layer)/second electrode (cathode)/adhesive/sealing member (5) Substrate/first electrode (anode)/anode buffer layer (hole injecting layer)/hole transporting layer/organic layer (light emitting layer)/hole blocking layer/electron transporting layer/cathode buffer layer (electron injecting layer)/second electrode (cathode)/adhesive/sealing member <Element Substrate>

The element substrate 11 (hereinafter, also referred to as base, substrate, substrate material, or support) may be composed of any transparent material, for example, glass or plastic. Preferred are a glass substrate and flexible substrate material. Examples of the flexible substrate material include transparent resin films and thin film glass.

Examples of the transparent resin films include polyesters, such as poly(ethylene terephthalate) (PET) and poly(ethylene naphthalate) (PEN); polyethylene; polypropylene; cellophane; cellulose esters and their derivatives, such as cellulose diacetate, cellulose triacetate (TAC), cellulose acetate butyrate, cellulose acetate propionate (CAP), cellulose acetate phthalate, and cellulose nitrate; poly(vinylidene chloride); poly(vinyl alcohol); poly(ethylene-vinyl alcohol); syndiotactic polystyrene; polycarbonates; norbornene resins; polymethylpentene; polyether ketones; polyimides; polyether sulfones (PESs); polyphenylene sulfide; polysulfones; polyether imides; polyether ketone imides; polyamides; fluorine resins; nylons; poly(methyl methacrylate); acrylics; polyarylates; and cycloolefin resins, such as ARTON (registered trademark, available from JSR Corporation) and APEL (registered trademark, available from Mitsui Chemicals Inc.).

In order to prevent, for example, vapor and oxygen permeation into the organic EL element 1, which includes an element substrate 11 formed of a transparent resin film, a coating film of inorganic or organic materials or a hybrid coating film composed of a laminate of the inorganic and organic films may be formed on the surface of the transparent resin film.

The coating film is preferably a barrier film having a vapor permeability of about 0.01 g/m2·24 h or less (at a condition of 25±0.5° C. and (90±2)% relative humidity (RH)); more preferably a barrier film having an oxygen permeability of about 10−3 ml/m2·24 h·atm or less and a vapor permeability of about 10−3 g/m2·24 h or less; particularly preferably a barrier film having an oxygen permeability of about 10−3 ml/m2·24 h·atm or less and a vapor permeability of about 10−5 g/m2·24 h or less.

The term "vapor permeability" refers to a value measured using an infrared sensor in accordance with the Japanese Industrial Standards, JIS K 7129 (2008), and "oxygen permeability" refers to a value measured using a coulometric sensor (Mocon method) in accordance with JIS K 7126 (2006).

The barrier film may be formed of any material that can block infiltration of substances, such as moisture and oxygen, which causes deterioration of the organic EL element 1, into the organic EL element 1.

Examples of the barrier film include a coating film formed of inorganic materials, such as silicon oxide, silicon dioxide, and silicon nitride. In order to improve the brittleness of the barrier film, the barrier film is preferably a hybrid coating film composed of a laminate of layers of the inorganic materials and organic materials described above. Two or more layers of inorganic materials and two or more layers of organic materials may be deposited in any order, but are preferably deposited alternately.

The barrier film may be formed by any method that can form a barrier film on an element substrate 11 (transparent resin film). Examples of the method include vacuum vapor deposition, sputtering, reactive sputtering, molecular beam epitaxy, cluster ion beam deposition, ion plating, plasma polymerization, atmospheric pressure plasma polymerization (see, Japanese Patent Application Laid-Open No. 2004-68143), plasma chemical vapor deposition (CVD), laser CVD, thermal CVD, and coating. Preferred is an atmospheric pressure plasma polymerization.

<First Electrode: Anode>

Preferred materials for the first electrode (anode) include metals, alloys, or electroconductive compounds having a high work function (4 eV or more) or mixtures thereof. Specific examples of the electrode material include metals such as Au and transparent electroconductive materials such as CuI, indium tin oxide (ITO), SnO2, and ZnO. Materials, such as IDIXO (In2O3-ZnO), capable of forming an amorphous transparent electroconductive film may also be used. Alternatively, coatable materials, such as organic electroconductive compounds, may be used. For extraction of emitted light from the first electrode (anode), the transmittance of the anode is desirably 10% or more, and the sheet resistance of the anode is preferably several hundred ohms per square or less. The thickness of the layer is selected from a range of, generally 10 to 1000 nm, preferably 10 to 200 nm depending on the material.

<<Organic Compound Layer>>

<Hole Injecting Layer: Anode Buffer Layer>

The hole injecting layer (anode buffer layer) is optionally disposed between the first electrode (anode) and the light emitting layer or hole transporting layer. The hole injecting layer is provided between an electrode and an organic functional layer in order to reduce the driving voltage and to improve the luminance. Such a layer is described in detail in "Denkyoku zairyo (Electrode material)", Div. 2 Chapter 2 (pp. 123-166) of "Yuki EL soshi to sono kogyoka saizensen (Organic EL Element and its frontier of industrialization)" (published by NTS Corporation, Nov. 30, 1998). The anode buffer layer (hole injecting layer) is also described in detail, for example, in Japanese Patent Application Laid-Open Nos. H09-45479, H09-260062, and H08-288069. Specific examples thereof include phthalocyanine buffer layers, such as copper phthalocyanine layers; oxide buffer layers, such as vanadium oxide layers; amorphous carbon buffer layers; polymer buffer layers containing electroconductive polymers, such as polyaniline (emeraldine) or polythiophene.

<Hole Transporting Layer>

The hole transporting layer is composed of a hole transporting material having hole transportability. The hole injecting layer and the electron blocking layer are also categorized into the hole transporting layer in a broad sense. The hole transporting layer may have a monolayer or multilayer structure. The hole transporting material has hole injectability or transportability or electron blockability and may be either an organic material or an inorganic material. Examples thereof include triazole, oxadiazole, imidazole, polyarylalkane, pyrazoline, pyrazolone, phenylenediamine, arylamine, amino substituted chalcone, oxazole, styryl anthracene, fluorenone, hydrazone, stilbene, and silazane derivatives, aniline copolymers, and electroconductive polymers/oligomers, particularly thiophene oligomers.

Among the materials described above usable for the hole transporting layer, preferred are porphyrin compounds, aromatic tertiary amine compounds, and styrylamine compounds; particularly preferred are aromatic tertiary amine compounds. Typical examples of the aromatic tertiary amine compounds and the styrylamine compounds include N,N,N',N'-tetraphenyl-4,4'-diaminophenyl, N,N'-diphenyl-N,N'-bis(3-methylphenyl)-(1,1'-biphenyl)-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl) phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds having two fused aromatic rings per molecule, described in U.S. Pat. No. 5,061,569, such as 4,4'-bis[N-(1-naphthyl)-N-phenylamino]biphenyl (α-NPD), and compounds described in Japanese Patent Application Laid-Open No. H04-308688, such as 4,4',4"-tris[N-(3-methylphenyl)-N-phenylamino]triphenylamine (MTDATA) in which three triphenylamine units are bonded into a starburst form.

Polymer materials containing the above compounds introduced into their chains or containing the above compounds as main chains can also be used. Inorganic compounds such as p-doped Si and p-doped SiC can also be used as the hole injecting material or the hole transporting material.

So-called p-type hole transporting materials as described in Japanese Patent Application Laid-Open No. H11-251067 and J. Huang, et al., (Applied Physics Letters, 80 (2002), p. 139) can also be used. In the present invention, these materials, which can provide highly efficient light emitting elements, are preferably used.

<Light Emitting Layer>

The light emitting layer includes blue, green, and red light emitting sublayers. These sublayers may be deposited in any order, and any two adjacent light emitting sublayers may be separated by a nonluminescent intermediate sublayer. In the present invention, at least one blue light emitting sublayer among the light emitting sublayers is preferably disposed closest to the anode.

In the case of the light emitting layer including four or more sublayers, blue, green, and red light emitting sublayers are preferably deposited in sequence, for example, from the anode side, blue light emitting sublayer/green light emitting sublayer/red light emitting sublayer/blue light emitting sublayer; blue light emitting sublayer/green light emitting sublayer/red light emitting sublayer/blue light emitting sublayer/green light emitting sublayer; or blue light emitting sublayer/green light emitting sublayer/red light emitting sublayer/blue light emitting sublayer/green light emitting sublayer/red light emitting sublayer, to achieve stable brightness. A white light emitting element can be prepared with a light emitting layer having a multilayer structure.

The light emitting layer may have any overall thickness, which is selected from the range of, generally 2 nm to 5 µm, preferably 2 to 200 nm, more preferably 10 to 20 nm, in view of, for example, the uniformity of the film and the voltage required for light emission. A thickness of 20 nm or less is preferred because of not only advantage in a voltage, but also advantage of stable color light emission regardless of a variable driving current. The light emitting sublayers may each have any thickness, which is selected from the range of, preferably 2 to 100 nm, more preferably 2 to 20 nm. The individual thicknesses of the blue, green, and red light emitting sublayers may be independently determined. The blue light emitting sublayer, however, preferably has the largest thickness (total thickness in the case of multiple layers) among the three light emitting sublayers.

The light emitting layer includes at least three sublayers having different emission spectra and maximum emission wavelengths in the range of 430 to 480 nm, 510 to 550 nm, and 600 to 640 nm, respectively. The number of the sublayers is not limited as long as it is more than three. In a light emitting layer including four or more sublayers, some sublayers may have the same emission spectrum. The blue light emitting sublayer has a maximum emission wavelength of 430 to 480 nm, the green light emitting sublayer has a maximum emission wavelength of 510 to 550 nm, and the red light emitting sublayer has a maximum emission wavelength of 600 to 640 nm.

Each light emitting sublayer may contain two or more luminescent compounds in amounts that allow the maximum emission wavelength to be within the above range. For example, the blue light emitting sublayer may contain a mixture of a blue luminescent compound having a maximum emission wavelength of 430 to 480 nm and a green luminescent compound having a maximum emission wavelength of 510 to 550 nm.

The light emitting layer may be formed of any organic luminescent material that has the following three functions: (a) a charge-injecting function that facilitates injection of holes from an anode or hole injecting layer or injection of electrons from a cathode or electron injecting layer under an applied electric field; (b) a transporting function that facilitates transportation of the injected holes or electrons under the electric filed; and (c) a luminescent function that facilitates recombination of the electrons and holes to emit light.

Examples of the usable material include fluorescent brightening agents, such as benzothiazole, benzimidazole, and benzoxazole fluorescent brightening agents; and styrylbenzene compounds. Examples of the benzoxazole fluorescent brightening agents include 2,5-bis(5,7-di-t-pentyl-2-benzoxazolyl)-1,3,4-thiadiazole, 4,4'-bis(5,7-t-pentyl-2-benzoxazolyl)stilbene, 4,4'-bis[5,7-di-(2-methyl-2-butyl)-2-benzoxazolyl]stilbene, 2,5-bis(5,7-di-t-pentyl-2-benzoxazolyl)thiophene, 2,5-bis[5-α,α-dimethylbenzyl-2-benzoxazolyl]thiophene, 2,5-bis[5,7-di-(2-methyl-2-butyl)-2-benzoxazolyl]-3,4-diphenylthiophene, 2,5-bis(5-methyl-2-benzoxazolyl)thiophene, 4,4'-bis(2-benzoxazolyl)biphenyl, 5-methyl-2-[2-[4-(5-methyl-2-benzoxazolyl)phenyl]vinyl]benzoxazole, and 2-[2-(4-chlorophenyl)vinyl]naphtho[1,2-d]oxazole. Examples of the benzothiazole fluorescent brightening agents include 2,2'-(p-phenylenedivinylene)bisbenzothiazole. Examples of the benzimidazole fluorescent brightening agents include 2-[2-[4-(2-benzimidazolyl)phenyl]vinyl]benzimidazole and 2-[2-(4-carboxyphenyl)vinyl]benzimidazole. Still other useful compounds are listed in "The Chemistry of Synthetic Dyes" (1971), pages 628-637 and 640. Specific examples of styrylbenzene compounds include 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-methylstyryl)benzene, 1,4-bis(2-methylstyryl)-2-methylbenzene, and 1,4-bis(2-methylstyryl)-2-ethylbenzene.

In addition to the fluorescent brightening agents and styrylbenzene compounds, further examples include 12-phthaloperinone, 1,4-diphenyl-1,3-butadiene, 1,1,4,4-tetraphenyl-1,3-butadiene, naphthalimide derivatives, perylene derivatives, oxadiazole derivatives, aldazine derivatives, pyrazoline derivatives, cyclopentadiene derivatives, pyrrolopyrrole derivatives, styrylamine derivatives, coumarin compounds, polymer compounds described in Appl. Phys. Lett., Vol. 58, 18, P 1982 (1991), and aromatic dimethylidene compounds. Specific examples of the aromatic dimethylidene compounds include 1,4-phenylenedimethylidene, 4,4'-phenylenedimethylidene, 2,5-xylylenedimethylidene, 2,6-naphthylenedimethylidene, 1,4-biphenylenedimethylidene, 1,4-p-terephenylenedimethylidene, 4,4'-bis(2,2-di-t-butylphenylvinyl)biphenyl, 4,4'-bis(2,2-diphenylvinyl)biphenyl, and derivatives thereof. Specific examples of the compounds represented by Formula (I) include bis(2-methyl-8-quinolinolato)(p-phenylphenolato)aluminum(III) and bis(2-methyl-8-quinolinolato)(1-naphtholato)aluminum(III).

Other compounds suitable for the organic luminescent materials are the above-described organic luminescent materials as host materials doped with strong blue to green fluorescent dyes, such as coumarin compounds, or compounds doped with the fluorescent dyes similar to that are used in the host materials. The compounds used as the organic luminescent materials can emit blue to green light with highly efficiency where the color varies depending on the type of the used dopant.

Specific examples of the host materials include organic luminescent materials having distyrylarylene backbones (4,4'-bis(2,2-diphenylvinyl)biphenyl is preferred). Specific examples of the dopant include diphenylaminovinylarylenes (N,N-diphenylaminobiphenylbenzene and 4,4'-bis[2-[4-(N,N-di-p-tolyl)phenyl]vinyl]biphenyl are preferred).

The light emitting layer preferably contains known host compounds and phosphorescent compounds (also referred to as phosphorescence emission compounds) to enhance the luminous efficiency of the light emitting layer.

The host compound is defined as a compound that is contained in the light emitting layer in a mass ratio of 20% or more in the layer and that has a phosphorescent quantum yield of less than 0.1, preferably less than 0.01, at room temperature (25° C.). Two or more host compounds may be used in combination. Use of different host compounds facilitates the control of the transportation of charge and enhances the efficiency of the organic EL element. Moreover, use of two or more phosphorescent compounds can generate any intended emission color by mixing of different emitted colors. White light emission can be achieved by optimizing the types and the amounts of the phosphorescent dopants used. Such white light emission is applicable to illumination and backlights.

Host compounds preferably have hole and electron transportability, prevent the shift of luminescence to the longer wavelength side, and have a high glass transition temperature (Tg). Such known host compounds are described, for example, in Japanese Patent Application Laid-Open Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837.

For a light emitting layer composed of multiple sublayers, these sublayers preferably contain the same host compound in at least 50% by mass so that all the organic sublayers readily have consistent film characteristics. The host compound preferably has a phosphorescence emission energy of 2.9 eV or more, which efficiently reduces the energy transfer from a dopant and advantageously provides high luminance. The phosphorescence emission energy is the peak energy of 0-0 band of the phosphorescence emission when the photoluminescence of a deposited film of a host compound having a thickness of 100 nm on a substrate is measured.

In view of, for example, the deterioration over time (decline in luminance, deterioration in film characteristics) of the organic EL element and the market needs as a light source, the host compound preferably has a phosphorescence emission energy of 2.9 eV or more and a Tg of 90° C. or more. That is, in order to satisfy the both of luminance and durability, the host compound preferably has a phosphorescence emission energy of 2.9 eV or more and a Tg of 90° C. or more, more preferably 100° C. or more.

The phosphorescent compound (phosphorescence emission compound) as defined in the invention is a compound in which emission of light from the excited triplet can be observed, which emits phosphorescence at room temperature (25° C.), and which has a phosphorescent quantum yield of 0.01 or more at 25° C. The phosphorescent compound in combination with the above-described host compound can produce an organic EL element having higher luminous efficiency.

The phosphorescent compound used in the present invention preferably has a phosphorescent quantum yield of 0.1 or more. The phosphorescent quantum yield can be measured by the method described in page 398 of "Bunkoh II of Dai 4 Han Jikken Kagaku Koza 7 (Spectroscopy II of The 4th Series of Experimental Chemistry 7)" (1992, published by Maruzen Co., Ltd.). The phosphorescent quantum yield in a solution can be measured with appropriate solvents. The only requirement for the phosphorescent compound used in the present invention is to have the above-mentioned phosphorescent quantum yield in any appropriate solvent.

Two emission mechanisms are known on a phosphorescent compound. One of them is emission of an energy transfer type, which involves the recombination of carriers on a host compound onto which the carriers are transferred to produce an excited state of the host compound, and emission from a phosphorescent compound due to transfer of this energy to the phosphorescent compound. The other is emission of a carrier trapping type, which involves recombination of carriers in a phosphorescent compound serving as a carrier trap and emission from the phosphorescent compound. In both types, it is essential that the energy in the excited state of the phosphorescent compound be lower than that in the excited state of the host compound.

The phosphorescent compound can appropriately be selected from known phosphorescent compounds used in layers of organic EL elements. Preferred examples of the phosphorescent compound include complex compounds containing metals belonging to Groups 8 to 10 in the periodic table, more preferably iridium compounds, osmium compounds, and platinum compounds (platinum complex compounds) and rare earth complexes. Most preferred are iridium compounds.

In the present invention, the phosphorescent compound may have any maximum emission wavelength. The emission wavelength can be varied by selecting, for example, a central metal, a ligand, and a ligand substituent in principle.

The light emitted from the organic EL element and the compounds used in the present invention is measured with a spectrophotometer CS-1000 (available from KONICA MINOLTA, INC.), and then the resulting values are defined by the CIE chromaticity coordinates to determine the color as described in FIG. 4.16 on page 108 of "Shinpen Shikisai Kagaku Handbook (Revised Color Science Handbook)" (edited by Color Science Association of Japan, University of Tokyo Press, 1985).

The white light emitting element in the present invention has a chromaticity in the range of X=0.33±0.07, Y=0.33±0.07 in the CIE 1931 color system at 1000 cd/m2 when the luminance at the front surface of the organic EL element is measured at a 2-degree field of view.

<Electron Injecting Layer>

The electron injecting layer is composed of a material having electron transportability and is categorized into the electron transporting layer in a broad sense. The electron injection layer is provided between an electrode and an organic functional layer in order to reduce the driving voltage and to improve the luminance. Such a layer is described in detail in "Denkyoku zairyo (Electrode material)", Div. 2 Chapter 2 (pp. 123-166) of "Yuki EL soshi to sono kogyoka saizensen (Organic EL element and its frontier of industrialization)" (published by NTS Corporation, Nov. 30, 1998). The electron injecting layer (cathode buffer layer) is described in Japanese Patent Application Laid-Open Nos. H06-325871, H09-17574 and H10-74586. Specific examples thereof include metal buffer layers, such as a strontium or aluminum layer; alkali metal compound buffer layers, such as a lithium fluoride; alkali earth metal compound buffer layers, such as a magnesium fluoride layer; and oxide buffer layers, such as an aluminum oxide layer.

The above buffer layer (injecting layer) is preferably very thin film having a thickness of 0.1 nm to 5 μm depending on the type of the materials used.

The electron transporting material (also used as hole blocking material) of the electron transporting layer, which is adjacent to the light emitting layer, can be made of any other material that can transport electrons injected from a cathode to a light emitting layer. Such a material can be selected from a variety of known compounds. Examples thereof include nitro-substituted fluorene derivatives, diphenylquinone derivatives, thiopyran dioxide derivatives, carbodiimides, fluorenylydenemethane derivatives, anthraquinodimethane and anthrone derivatives, and oxadiazole derivatives. Moreover, thiadiazole derivatives having thiadiazole rings, which contain sulfur atoms in place of the oxygen atoms in the oxadiazole rings of the oxadiazole derivatives, and quinoxaline derivatives, which contain quinoxaline rings known as electron-attractive groups, can also be used for the electron transport material. Any polymer material, which any of the above materials is introduced to the polymer chains or constitutes the main chain, can also be used.

Further examples of the electron transport material preferably used include metal complexes of 8-quinolinol derivatives, such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, and bis(8-quinolinol)zinc (Znq), and substitution products of these metal complexes of which the central metallic atoms are replaced with In, Mg, Cu, Ca, Sn, Ga, or Pb. Metal-free or metal phthalocyanines can also be used for the electron transport material, and end groups of these phthalocyanines may be replaced with alkyl groups or sulfonic acid groups. Distyrylpyrazine derivatives can also be used for the electron transport material. Inorganic semiconductors, such as n-doped Si and n-doped SiC, can also be used for the electron transport material as used in the hole injecting layer and the hole transporting layer. The electron transporting layer may have any thickness, but generally a thickness of about 5 nm to 5 μm, preferably 5 to 200 nm. The electron transporting layer may have a single-layer structure containing one or more of the above-described materials.

The electron transporting layer may also include materials doped with impurities to have high n-type conductivity. Examples thereof are described in Japanese Patent Application Laid-Open Nos. H04-297076, H10-270172, 2000-196140, and 2001-102175, and J. Appl. Phys., 95, 5773 (2004). Such high n-type electron transport materials, which can produce elements with lower power consumption, are preferably used.

The organic EL element of the present invention has an external quantum efficiency of preferably 1% or more, more preferably 5% or more at room temperature, where External quantum efficiency (%)=(the number of photons output from the organic EL element)/(the number of electrons input into the organic EL element)×100.

A hue adjust filter, such as a color filter, and/or a color conversion filter converting the light emitted from the organic EL element to multicolor with phosphor may be used in combination. A color conversion filter is preferably applied to an organic EL element emitting light with a maximum wavelength λmax of 480 nm or less.

<Electron Injecting Layer: Cathode Buffer Layer>

The electron injecting layer (cathode buffer layer), which is formed during the process of forming an electron injecting layer, is composed of a material having electron transportability and is categorized into the electron transporting layer in a broad sense.

The electron injecting layer is provided between an electrode and an organic functional layer in order to reduce the driving voltage and to improve the luminance. Such a layer is described in detail in "Denkyoku zairyo (Electrode material)", Div. 2 Chapter 2 (pp. 123-166) of "Yuki EL soshi to sono kogyoka saizensen (Organic EL element and its frontier of industrialization)" (published by NTS Corporation, Nov. 30, 1998).

The electron injecting layer (cathode buffer layer) is described in detail in, for example, Japanese Patent Application Laid-Open Nos. H06-325871, H09-17574, and H10-74586. Specific examples thereof include metal buffer layers, such as strontium and aluminum layers; alkali metal compound buffer layers, such as lithium fluoride layers; alkali earth metal compound buffer layers, such as magnesium fluoride layers; and oxide buffer layers, such as aluminum oxide layers.

<Second Electrode: Cathode>

The second electrode (cathode) is composed of a metal (referred to as electron-injecting metal), an alloy, or a conductive compound having a small work function (4 eV or less), or a mixture thereof.

Specific examples of such electrode substances include sodium, sodium-potassium alloys, magnesium, lithium; mixtures of magnesium and copper, magnesium and silver, magnesium and aluminum, magnesium and indium, and aluminum and aluminum oxide (Al2O3); indium; mixtures of lithium and aluminum; and rare earth metals.

Among them, preferred are mixtures of an electron-injecting metal and a stable metal having a work function larger than that of the electron-injecting metal, such as mixtures of magnesium and silver, magnesium and aluminum, magnesium and indium, aluminum and aluminum oxide (Al2O3), and lithium and aluminum; and aluminum in view of their high electron-injecting properties and oxidation resistance. These electrode substances may be formed into thin-film cathodes by, for example, evaporation or sputtering.

Either the first electrode (anode) or the second electrode (cathode) of the organic EL element is preferably to be transparent or translucent so that emitted light penetrates therethrough, to enhance the luminance of the emitted light.

Any of the above metals is formed into a film having a thickness of 1 to 20 nm, and then the transparent conductive materials mentioned in the above description on the first electrode is disposed on the film into a transparent or translucent second electrode (cathode). Through this procedure, an element including a first electrode (anode) and a second electrode (cathode) that are transparent can be produced.

<Sealing Member>

The configuration of the sealing member will now be described.

A substrate to which the sealing member of the present invention is applied is a flexible substrate. Examples thereof include thermoplastic resin films generally used for packaging, such as ethylene tetrafluoroethyl copolymer (ETFE), high density polyethylene (HDPE), oriented polypropylene (OPP), polystyrene (PS), poly(methyl methacrylate) (PMMA), oriented nylon (ONy), polyethylene terephthalate (PET), polycarbonate (PC), polyimides, and polyether styrene (PES). It is noted that such a thermoplastic resin film can be coextruded with an optionally different film into a multilayer film or can be bonded with another film at different orientation angles into a multilayer film. It is noted that the density and the molecular weight distribution of the film used can be properly combined in order to achieve required physical characteristics.

The thermoplastic resin film should be overlaid with a gas barrier layer through a vapor deposition or coating process. Examples of the gas barrier layer include metallized films and metal foils. Examples of the inorganic evaporated film include metallized films described in "Hakumaku handobukku (Thin Film Handbook)", pp 879-901 (Japan Society for the Promotion of Science), "Shinku gijutsu handobukku (Vacuum Technology Handbook)", pp 502-509, 612, and 810 (Nikkan Kogyo Shimbun, Ltd.), and "Shinku handobukku zoteiban (Vacuum Handbook, Revised and Enlarged Edition)", pp 132-134 (ULVAC Japan Vacuum Technology, Inc.). For example, metals, such as In, Sn, Pb, Au, Cu, Ag, Al, Ti, and Ni are used.

Examples of the material that can be used for the metal foils include metals, such as aluminum, copper, and nickel, and alloys, such as stainless steel and aluminum alloys, preferably aluminum due to low material cost and easy processability. The film thickness is about 1 to 100 μm, preferably about 10 to 50 μm.

In order to facilitate the handling during production, a laminated film of, for example, polyethylene terephthalate) or nylon may be used. The flexible sealing member formed of a resin film preferably includes a thermoplastic adhesive resin layer provided on the side in contact with a liquid sealing agent.

A protective layer may further be provided on the gas barrier layer. The protective layer preferably has a thickness of 100 nm to 200 μm in view of the stress cracking resistance and electrical insulation of the gas barrier layer, and the adhesion characteristics (bonding strength and followability to asperity) for the use as a sealing agent layer. The protective layer is formed of a thermoplastic resin film having a melt flow rate of, preferably 5 to 20 g/10 min, more preferably 6 to 15 g/10 min in accordance with JIS K 7210-1999.

This is because a resin having a melt flow rate of 5 g/10 min or less cannot completely fill gaps due to the asperities on the anode and cathode, whereas a resin having a melt flow rate of 20 g/10 min or more exhibits, for example, reduced tensile strength and stress cracking resistance, and insufficient processability.

The sealing member has a vapor permeability of, preferably 0.01 g/m2·24 h or less and an oxygen permeability of, preferably 0.1 ml/m2·24 h·atm or less in view of, for example, the gas barrier required for commercially produced organic EL elements. The moisture permeability is a value measured mainly by the Mocon method in accordance with JIS K 7129B (1992). The oxygen permeability is measured mainly by the Mocon method in accordance with JIS K 7126B (1987).

The flexible sealing member preferably has a Young's modulus of $1 \times 10^{-3}$ to 80 GPa and a thickness of 10 to 500 μm in view of, for example, the adhesiveness to an organic EL element and preventing a liquid adhesive from spreading.

<Adhesive>

Examples of the adhesive used for the production of the organic EL element of the present invention include photocurable or thermocurable liquid adhesives, thermoplastic resins, and photocurable resins.

Examples of the liquid adhesives include photocurable or thermocurable sealing agents having reactive vinyl groups, such as acrylic acid oligomers and methacrylic acid oligomers; moisture curable adhesives, such as 2-cyanoacrylate ester; and thermally or chemically curable (mixture of two liquid) adhesives, such as epoxy adhesives, and cationically UV curable epoxy resin adhesives. The liquid adhesives may preferably contain any filler, if necessary. The content of the filler is preferably 5 to 70 volume % in view of the adhesive bonding strength.

The filler preferably has a size of 1 to 100 μm in view of the adhesive bonding strength and the thickness of the adhesive after being bonded under pressure. Any filler may be added, for example, soda glass, alkali-free glass or silica, titanium dioxide, antimony oxide, titania, alumina, zirconia, and metal oxides such as tungsten oxide.

The sealing member is bonded to an organic EL structure with a liquid adhesive under a reduced pressure of 10 to $1 \times 10^{-5}$ Pa to achieve a stable bonding operation of the bonding portion, to prevent trapping of air bubbles in the bonding portion, and to maintain the flatness of a flexible sealing member.

Examples of the thermoplastic resins used include a thermoplastic resin having a melt flow rate of, preferably 5 to 20 g/10 min, more preferably 6 to 15 g/10 min in accordance with JIS K 7210-1999.

This is because a resin having a melt flow rate of 5 g/10 min or less cannot completely fill gaps due to the asperities on the anode and cathode, whereas a resin having a melt flow rate of 20 g/10 min or more exhibits, for example, reduced tensile strength and stress cracking resistance, and insufficient processability. The bonding can be carried out through any generally known process, for example, wet lamination, dry lamination, hot melt lamination, extrusion lamination, or thermal lamination.

Any thermoplastic resin having the numerical values described above may be used. Examples of the usable thermoplastic resin include polymer films described in "Kinousei housou zairyo no Shintenkai (New Development in Functional Packaging Material)" (Toray Research Center, Inc.), such as low density polyethylene (LDPE), HDPE, linear low density polyethylene (LLDPE), medium density polyethylene, cast polypropylene (CPP), OPP, ONy, PET, cellophane, poly(vinyl alcohol) (PVA), oriented vinylon (OV), ethylene-vinyl acetate copolymer (EVOH), ethylene-propylene copolymer, ethylene-acrylic acid copolymer, ethylene-methacrylic acid copolymer, and vinylidene chloride (PVDC). Among them, particularly preferred are LDPE, LLDPE, and also metallocene catalyzed LDPE and LLDPE, and a thermoplastic resin formed of a mixture of LDPE, LLDPE, and HDPE.

In the present invention, the thermal energy, which is generated by the emission of the organic EL element during an aging process, may be used for curing of the adhesives in particular thermosetting resins.

As described above, the light diffusion sheet for the organic EL element of the present invention can be provided to the organic EL panel to significantly enhance the incombustibility and light diffusion property.

EXAMPLES

The present invention will now be described in detail with non-limiting examples. In the examples, the terms "parts" and "%" represent "parts by mass" and "mass %", respectively, unless otherwise mentioned.

The light diffusion sheets for the organic EL elements of the present invention will now be described in detail with examples. The examples should not be construed to limit the scope of the invention.

(Preparation of Light Diffusion Sheet a)

A plain-woven glass fiber cloth (the count of the glass fiber: 22.5 tex, the diameter of the glass fiber: 7 μm) having a weaving density of 62 yarns (warp)×58 yarns (weft) (yarn/25 mm2), a basis weight of 108 g/m2, and a thickness of 89 μm was subjected to heat cleaning so that a glass fiber cloth A was prepared.

A 0.5% ethylene-vinyl acetate copolymer solution (Product name: Polysol EVA AD-18, available form Showa Denko K.K.) was added to colloidal silica having a solid content of 40% and an average particle diameter of 20 nm (Product name: Silicadol 40, available from NIPPON CHEMICAL INDUSTRIAL CO., LTD.) and then stirred for 30 minutes so that a solution A including dispersed colloidal silica particles having a solid content of 40.5% was prepared.

The glass fiber cloth A was impregnated with the solution A and then was pressed through nip rolls to squeeze out excess solution A. The glass fiber cloth A was then dried with a hot air drier at 150° C. for five minutes to fix the colloidal silica particles on the surface of the glass fiber cloth A. The amount of the colloidal silica adhering to the glass fiber cloth A was 12.2 g/m2.

The resultant glass fiber cloth A was impregnated with metal alkoxide (Product name: AR-709MD-CR.02, available from A.R.D.). Excess metal alkoxide was then removed with a doctor bar to adjust the amount of the metal alkoxide adhering to the glass fiber cloth A. The glass fiber cloth A was then dried with a hot air drier at 130° C. for five minutes to prepare a light diffusion sheet a for an organic EL element. The amount of the metal alkoxide adhering to the light diffusion sheet a was 10.3 g/m2.

(Preparation of Light Diffusion Sheet b)

A light diffusion sheet b for an organic EL element was prepared as in the preparation of the light diffusion sheet a, except that a glass fiber cloth B was used instead of the glass fiber cloth A. The glass fiber cloth B was prepared by executing the heat cleaning to a plain-woven glass fiber cloth (the count of the glass fiber: 22.5 tex, the diameter of the glass fiber: 7 μm) having a weaving density of 60 yarns (warp)×58 yarns (weft) (yarn/25 mm2), a basis weight of 108 g/m2, and a thickness of 100 μm. The colloidal silica and metal alcoholate were applied on the light diffusion sheet b as in the preparation of the light diffusion sheet a, the amounts of the colloidal silica and metal alcoholate adhering to the light diffusion sheet b being 12.2 g/m2 and 10.3 g/m2, respectively.

(Preparation of light diffusion sheet c)

A light diffusion sheet c for an organic EL element was prepared as in the preparation of the light diffusion sheet a, except that a glass fiber cloth C was used instead of the glass fiber cloth A. The glass fiber cloth C was prepared by executing the heat cleaning to a plain-woven glass fiber cloth (the count of the glass fiber: 33.7 tex, the diameter of the glass fiber: 6 μm) having a basis weight of 149 g/m2, and a thickness of 120 μm. The colloidal silica and metal alkoxide were applied on the light diffusion sheet c as in the preparation of the light diffusion sheet a, the amounts of the colloidal silica and metal alkoxide adhering to the light diffusion sheet c being 12.6 g/m2 and 10.8 g/m2, respectively.

(Preparation of Light Diffusion Sheet d)

A plain-woven glass fiber cloth (the count of the glass fiber: 67.5 tex, the diameter of the glass fiber: 9 μm) having a basis weight of 217 g/m2, and a thickness of 174 μm was subjected to the heat cleaning so that a glass fiber cloth D was prepared. The resultant glass fiber cloth D was impregnated with metal alkoxide (Product name: AR-709MD-CR.02, available from A.R.D.). Excess metal alkoxide was then removed with a doctor bar to adjust the amount of the metal alkoxide adhering to the glass fiber cloth D. The glass fiber cloth D was then dried with a hot air drier at 130° C. for five minutes to prepare a light diffusion sheet d for an organic EL element. The amount of the metal alkoxide adhering to the light diffusion sheet d were 22.5 g/m2.

(Preparation of Light Diffusion Sheet e)

A plain-woven glass fiber cloth (the count of the glass fiber: 135 tex, the diameter of the glass fiber: 9 μm) having a basis weight of 347 g/m2, and a thickness of 262 μm was subjected to the heat cleaning so that a glass fiber cloth E was prepared. The resultant glass fiber cloth E was impregnated with a solution containing acrylic polyol (ACRYDIC 49-394IM, <solid content of 60%>, available from MITSUI TAKEDA CHEMICALS, INC.) of 32 parts by mass, silicone resin particles (average diameter of 27.2 μm) of 180 parts by mass, silicone resin particles (average diameter of 30.0 μm) of 40 parts by mass, and butyl acetate of 215 parts by mass. The glass fiber cloth E was then dried with a hot air drier at 130° C. for five minutes so that a light diffusion sheet e for an organic EL element was prepared.

Example 1

Preparation of Element Substrate

An element substrate with a gas barrier layer, which included a silicon nitride film functioning as the gas barrier layer on the surface of the element substrate, was prepared by plasma CVD with a CVD apparatus under the condition described below.

The element substrate used was a PET film ("Tough Top" available from Toray Advanced Film Co., Ltd.) having a thickness of 125 μm. The element substrate was disposed at a predetermined position in a vacuum chamber, which was then hermetically closed.

The vacuum chamber was evacuated to 0.01 Pa and then charged with silane, ammonia, and nitrogen reaction gases. The flow rates of the silane, ammonia, and nitrogen gases were 50 mL/min, 100 mL/min, and 150 mL/min, respectively, at 1013 hPa and 25° C. The vacuum chamber was then evacuated to 100 Pa.

A high frequency power of 750 W was applied across the electrodes to form a silicon nitride film functioning as a gas barrier layer having a thickness of 100 nm on the surface of the element substrate. The resultant element substrate had gas barrier properties of an oxygen permeability of 0.01 ml/m2·24 h·atm or less, and a vapor permeability of 0.01 g/m2·24 h·atm or less.

(Preparation of Organic EL Element)

An indium tin oxide (ITO) anode having a thickness of 110 nm was formed on the resultant element substrate with a sputtering apparatus. The ITO was patterned by photolithography, and the substrate with the ITO transparent electrode was then ultrasonically washed in isopropyl alcohol, was dried in a dry nitrogen gas stream, and was washed with UV ozone for five minutes.

The substrate was fixed to a holder of a commercially-available vacuum evaporation apparatus. The vapor deposition crucibles in the vacuum evaporation apparatus were respectively filled with CuPc (copper phthalocyanine), α-NPD, FIr(pic), DPVBi, CBP, Ir(ppy)3, Ir(piq)3, BAlq, Alq, and LiF in optimal volumes for preparation of organic EL elements. The vapor deposition crucibles were composed of heat-resistant materials, such as molybdenum and tungsten.

[Chemical Formula 1]

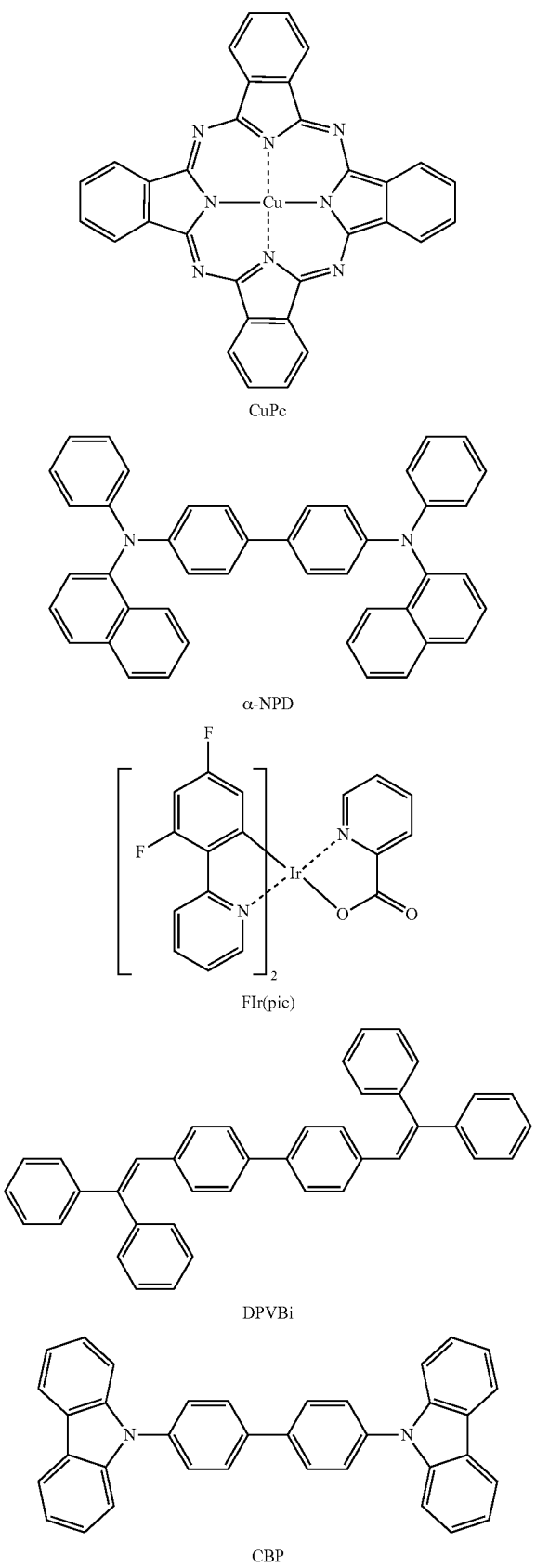

The vacuum chamber was then evacuated to 4×10-4 Pa, and the crucible filled with CuPc was electrically heated to deposit CuPc on the ITO electrode side of the element substrate at a deposition rate of 0.1 nm/sec, so that a hole injecting layer of 15 nm was formed.

Then α-NPD was deposited on the hole injecting layer at a deposition rate of 0.1 nm/sec so that a hole injecting transport layer of 25 nm was formed.

FIr(pic) (3 mass %) and DPVBi as a host compound were codeposited on the hole injection transport layer at an overall deposition rate of 0.1 nm/sec so that a blue light emitting layer having a thickness of 15 nm was formed.

Then, CBP was deposited on the blue light emitting layer at a deposition rate of 0.1 nm/sec so that an interlayer of 5 nm was formed.

Ir(piq)3 (8 mass %) and CBP as a host compound were codeposited on the interlayer at a total deposition rate of 0.1 nm/sec so that a red light emitting layer having a thickness of 10 nm was formed.

BAlq was then deposited on the red light emitting layer at a deposition rate of 0.1 nm/sec so that a hole blocking layer of 15 nm was formed.

Alq was then deposited on the hole blocking layer at a deposition rate of 0.1 nm/sec so that an electron transporting layer of 30 nm was formed.

LiF was deposited on the electron transporting layer at a deposition rate of 0.1 nm/sec so that an electron injecting layer of 1 nm was formed.

Finally, aluminum was deposited to form a cathode having a thickness of 110 nm, preparing an organic EL element. The resultant organic EL element had a light emitting pattern of 20 mm×16.5 mm×4 pixels which can be divided into four parts (the total dimension of the four pixels is 41×34 mm).

(Preparation of Organic EL Panel A)

An aluminum foil having a thickness of 30 μm was laminated, as a gas barrier layer, on a polyethylene terephthalate (PET) film having a thickness of 25 μm, so that a sealing material was produced.

The aluminum foil surface of the sealing material was coated with a thermosetting adhesive, Struct Bond E-413 (available from Mitsui Chemicals, Inc.) and the sealing material was left to stand. The sealing material was bonded to the organic EL element such that the thermosetting adhesive was placed between the aluminum foil of the sealing material and the cathode of the organic EL element. The resultant laminate was pressed with a vacuum laminator at a pressure force of 0.1 MPa and at 100° C. and for 60 seconds under a reduced-pressure environment of 1×10−2 Pa, and was thermally cured at 100° C. for 30 minutes to seal the body of the organic EL element.

Silica having an average diameter of 0.8 μm was added to 100 parts by mass of thermosetting adhesive, Struct Bond E-413 (available from Mitsui Chemicals, Inc.) with a paint shaker under a condition at 20° C. for two hours, and the dispersion was applied to the surface of a light diffusion sheet a. The organic EL element was disposed on the light diffusion sheet a such that the surface of the light diffusion sheet a coated with the adhesive was in contact with the element substrate of the organic EL element. The resultant laminate was pressed with a vacuum laminator at a pressure force of 0.1 MPa and at 100° C., for 60 seconds under a reduced-pressure environment of 1×10−2 Pa, and was thermally cured at 100° C. for 30 minutes to prepare an organic EL panel A. The thermosetting adhesive, Struct Bond E-413 had a total light transmittance of 90%.

Example 2

An organic EL panel B was prepared as in Example 1, except that the light diffusion sheet a was replaced with a light diffusion sheet b.

Example 3

An organic EL panel C was prepared as in Example 1, except that the light diffusion sheet a was replaced with a light diffusion sheet c.

Comparative Example 1

An organic EL panel D was prepared as in Example 1, except that the light diffusion sheet a was replaced with a light diffusion sheet d.

Comparative Example 2

An organic EL panel E was prepared as in Example 1, except that the light diffusion sheet a was replaced with a light diffusion sheet e.

Comparative Example 3

An organic EL panel F was prepared as in Example 1, except that the organic EL panel F included only the sealing material but not the light diffusion sheet a.

The organic EL panels prepared through the above procedures are shown in Table 1.

(Condition for Evaluation Test)

The light diffusion sheets a to e and the organic EL panels A to F were evaluated for the properties described below. Evaluation items for the light diffusion sheets were haze value and total light transmittance. Evaluation items for the organic EL panels A to E were luminance, adhesiveness, and incombustibility. Evaluation items for the organic EL panel F was luminance and incombustibility. The results of evaluation were shown in Table 2.

<Evaluation of Haze Value and Total Light Transmittance>

The haze values (%) and total light transmittance of the light diffusion sheets were evaluated in accordance with JIS K 7136-2000 and JIS K 7361-1-1997, respectively, with NDH4000 available from Nippon Denshoku Industries Co., Ltd.

<Evaluation of Luminescence>

Luminescence was Evaluated as Follows:

(Luminance)

A direct current of 2.5 mA/cm2 was applied between the anode and cathode of a fresh organic EL element immediately after the production to evaluate the luminance (initial luminance).

(Light Extraction Rate)

The light extraction rate (%) was calculated by determining the relative ratio of the luminance of each of the organic EL panels A to E including the respective light diffusion sheets a to e with respect to the luminance of the organic EL element F of Comparative Example 4. Higher light extraction rate indicates higher performance of an organic EL panel.

(Angular Dependence)

From a direction perpendicular to the light emitting surface, the xy chromaticity of the luminous color of the organic EL panels charged with a constant current of 2.5 mA/cm2 was measured at angles of 0° and 60°. The difference Δx between the x value at 0° and the x value at 60° was determined to evaluate the angular dependence, and a difference Δx of 0.03 or less was represented by "Good", while a difference Δx greater than 0.03 was represented by "Not good". The luminance (cd/m2) and angular dependence were evaluated with a spectroradiometer (CS-2000, available from Konica Minolta, Inc.).

<Evaluation of Adhesiveness (Delamination Strength)>

The delamination strength of the light diffusion sheets a to e of the respective organic EL panels A to E was evaluated. The delamination strength of the organic EL panels A to E was also evaluated after aging in an environment of 60° C. and 90% RH for 500 hours. The delamination strength (N/cm) was evaluated with a 180° peel tester available from IMADA CO., LTD.

<Evaluation of Incombustibility>

Each of the organic EL panels A to F was flamed for five minutes while being heated by a radiant heat of 3.5 W/cm2 to determine a Peak RHR (rated heat release) (kW/m2) and THR (total heat release) (kW×min/m2) in two minutes. Lower Peak RHR and THR indicate higher incombustibility.

(Result of Evaluation)

The results of the evaluation are shown in Tables 1 and 2.

It is apparent form the above description that the present invention can provide organic EL panels exhibiting high light extraction efficiency (light diffusion property) and high incombustibility.

EXPLANATION OF SIGNS

1 Organic EL element
2 Light diffusion sheet for organic EL element
3 Sealing member
4, 5 Adhesive layer
10 Organic EL panel
11 Element substrate
12 Anode
13 Organic compound layer
14 Organic compound layer
15 Cathode

TABLE 1

| ORGANIC EL PANEL | LIGHT DIFFUSION SHEET | SUBSTRATE MATERIAL | BASIS WEIGHT [g/m²] | THICKNESS [μm] | MATERIALS CONTAINED IN SOLUTION | HAZE VALUE [%] | TOTAL TRANSMITTANCE [%] | REMARKS |
|---|---|---|---|---|---|---|---|---|
| A | a | GLASS FIBER CLOTH | 108 | 89 | COLLOIDAL SILICA METAL ALKOXIDE | 97.3 | 53.7 | EXAMPLE |
| B | b | GLASS FIBER CLOTH | 108 | 100 | COLLOIDAL SILICA METAL ALKOXIDE | 97.9 | 53.2 | EXAMPLE |
| C | c | GLASS FIBER CLOTH | 149 | 120 | COLLOIDAL SILICA METAL ALKOXIDE | 98.0 | 41.0 | EXAMPLE |
| D | d | GLASS FIBER CLOTH | 217 | 174 | METAL ALKOXIDE | 98.6 | 48.0 | COMPARATIVE EXAMPLE |
| E | e | GLASS FIBER CLOTH | 347 | 262 | ACRYLIC RESIN | 98.6 | 38.6 | COMPARATIVE EXAMPLE |
| F | — | — | — | — | — | — | — | COMPARATIVE EXAMPLE |

TABLE 2

| ORGANIC EL PANEL | LUMINANCE [cd/m²] | LIGHT EXTRACTION RATE[%] | ANGLE DEPENDENCE | DELAMINATION STRENGTH INITIAL [N/cm] | DELAMINATION STRENGTH AFTER 500 HRS. [N/cm] | INCOMBUSTIBILITY Peak RHR [kW/m²] | INCOMBUSTIBILITY THR [kW·min/m²] | REMARKS |
|---|---|---|---|---|---|---|---|---|
| A | 894 | 149 | Good | 5.21 | 3.89 | 55 | 37 | EXAMPLE |
| B | 882 | 147 | Good | 5.55 | 3.88 | 44 | 44 | EXAMPLE |
| C | 780 | 130 | Good | 5.25 | 3.55 | 47 | 40 | EXAMPLE |
| D | 660 | 110 | Not good | 5.05 | 3.21 | 81 | 54 | COMPARATIVE EXAMPLE |
| E | 630 | 105 | Not good | 5.34 | 3.43 | 102 | 86 | COMPARATIVE EXAMPLE |
| F | 600 | 100 | Not good | — | — | 277 | 186 | COMPARATIVE EXAMPLE |

Table 2 demonstrates that the organic EL panels A to C of Examples 1 to 3 each exhibit a light extraction rate above 120% and high angular dependence. This results show that the use of a predetermined light diffusion sheet achieves high light extraction efficiency (light diffusion property).

Table 2 also demonstrates the organic EL panel, which has the light diffusion sheet including the glass fiber cloth, provides a lower Peak RHR, a lower THR in two minutes, and higher incombustibility than those of the organic EL panel F of Comparative Example 3, which includes no glass fiber cloth.

In particular, the organic EL panels A and B of Examples 1 and 2, each having a glass fiber cloth impregnated with colloidal silica resin and metal alkoxide resin, a basis weight of 80 to 120 g/m2, and a thickness of 80 to 120 μm, exhibit a light extraction rate above 140% while maintaining incombustibility. The organic EL panels A and B thus exhibit high light extraction efficiency (light diffusion property).

What is claimed is:

1. A light diffusion sheet for an organic electroluminescent element to be used in an organic electroluminescent panel, the light diffusion sheet comprising:

a glass fiber cloth composed of at least one glass fiber, wherein the glass fiber is selected from at least one of general-purpose alkali-free glass fibers, alkali-containing glass fibers having acid resistance, glass fibers having high strength and high modulus, and alkali-resistant glass fibers;

particles of silica on a surface of the glass fiber or between the glass fibers; and at least one selected from a group consisting of metal alkoxides and reaction products of metal alkoxides, wherein the silica has an average particle diameter ranging from 5 to 300 nm.

2. The light diffusion sheet for the organic electroluminescent element of claim 1, wherein the light diffusion sheet has a total light transmittance of 45% or more and less than 60%.

3. The light diffusion sheet for the organic electroluminescent element of claim 1 or claim 2, wherein the light diffusion sheet has a haze value of 90% or more.

4. The light diffusion sheet for the organic electroluminescent element of claim 1, wherein
the glass fiber cloth has a mass per unit area ranging from 80 to 120 g/m$^2$, and
the glass fiber cloth has a thickness ranging from 80 to 120 μm.

5. An organic electroluminescent panel comprising the light diffusion sheet for the organic electroluminescent element of claim 1.

6. A manufacturing method of the light diffusion sheet for the organic electroluminescent element of claim 1, comprising:
performing a heat cleaning of the glass fiber cloth;
treating the glass fiber cloth subjected to heat cleaning with a silane coupling agent;
impregnating the glass fiber cloth treated with the silane coupling treatment with a binder solution containing colloidal silica; and
impregnating the glass fiber cloth impregnated with the colloidal silica with a solution containing a metal alkoxide.

* * * * *